United States Patent
Uesugi et al.

(10) Patent No.: US 10,395,932 B2
(45) Date of Patent: Aug. 27, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Kenjiro Uesugi, Kawasaki (JP); Toshiki Hikosaka, Kawasaki (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 91 days.

(21) Appl. No.: 15/670,445

(22) Filed: Aug. 7, 2017

(65) Prior Publication Data

US 2018/0174849 A1 Jun. 21, 2018

(30) Foreign Application Priority Data

Dec. 19, 2016 (JP) ................. 2016-245741

(51) Int. Cl.
*H01L 21/28* (2006.01)
*H01L 21/44* (2006.01)
(Continued)

(52) U.S. Cl.
CPC .. *H01L 21/28273* (2013.01); *H01L 21/28008* (2013.01); *H01L 21/44* (2013.01); *H01L 23/482* (2013.01); *H01L 23/53295* (2013.01)

(58) Field of Classification Search
CPC ............. H01L 21/28273; H01L 23/482; H01L 21/28008; H01L 21/44; H01L 23/53295
See application file for complete search history.

(56) References Cited

U.S. PATENT DOCUMENTS

2008/0237640 A1* 10/2008 Mishra ................. H01L 29/0891
257/194
2009/0072240 A1 3/2009 Suh et al.
(Continued)

FOREIGN PATENT DOCUMENTS

JP 2008-235347 10/2008
JP 2010-114238 5/2010
(Continued)

*Primary Examiner* — Yasser A Abdelaziez
(74) *Attorney, Agent, or Firm* — Oblon, McClelland, Maier & Neustadt, L.L.P.

(57) ABSTRACT

According to one embodiment, a semiconductor device includes first, second, and third electrodes, and first, second, third, fourth, and fifth semiconductor regions. The first electrode includes a first conductive region. The second electrode includes a second conductive region separated. The third electrode includes a third conductive region. The first semiconductor region is separated from the first, second, and third conductive regions. The second semiconductor region is provided between the first conductive and semiconductor regions, between the second conductive and first semiconductor regions, and between the third conductive and first semiconductor regions. The third semiconductor region is provided between the first conductive region and the second semiconductor region. The fourth semiconductor region is provided between the second conductive region and the second semiconductor region. The fifth semiconductor region is provided between the third conductive region and the second semiconductor region and between the third and fourth semiconductor regions.

19 Claims, 3 Drawing Sheets

(51) Int. Cl.
*H01L 23/532* (2006.01)
*H01L 23/482* (2006.01)

(56) References Cited

U.S. PATENT DOCUMENTS

| | | | |
|---|---|---|---|
| 2010/0159656 A1* | 6/2010 | Nakata | H01L 29/7787 |
| | | | 438/268 |
| 2014/0203289 A1* | 7/2014 | Liu | H01L 29/432 |
| | | | 257/76 |
| 2016/0172473 A1* | 6/2016 | Suzuki | H01L 29/7786 |
| | | | 257/43 |
| 2017/0125545 A1* | 5/2017 | Yamada | H01L 21/2258 |
| 2017/0125567 A1* | 5/2017 | Yamada | H01L 21/0254 |
| 2017/0278961 A1* | 9/2017 | Hill | H01L 29/32 |
| 2018/0350965 A1* | 12/2018 | Shibata | H01L 29/7787 |

FOREIGN PATENT DOCUMENTS

| | | |
|---|---|---|
| JP | 2011-9493 | 1/2011 |
| WO | WO 2009/036181 A2 | 3/2009 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2016-245741, filed on Dec. 19, 2016; the entire contents of which are incorporated herein by reference.

FIELD

Embodiments described herein relate generally to a semiconductor device and a method for manufacturing the same.

BACKGROUND

For example, stable operations are desirable in a semiconductor device.

DETAILED DESCRIPTION

Figure 1:
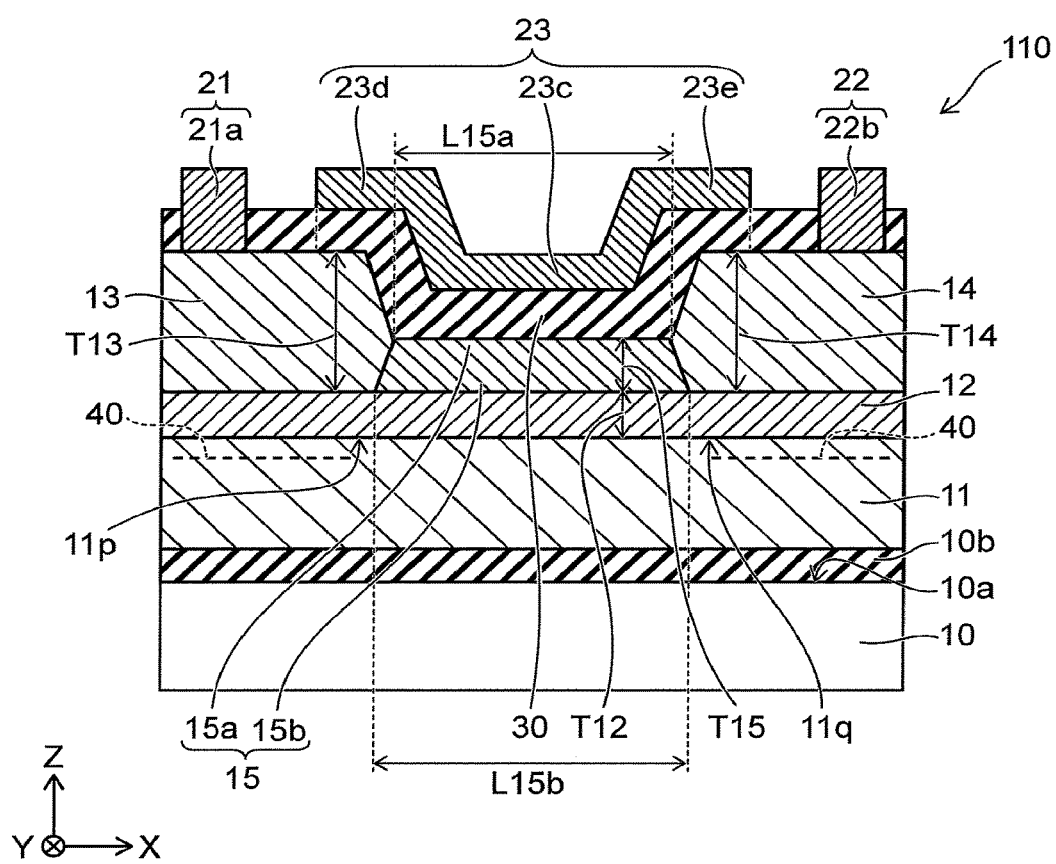
FIG. 1 is a schematic cross-sectional view illustrating a semiconductor device according to an embodiment.

According to one embodiment, a semiconductor device includes a first electrode, a second electrode, a third electrode, a first semiconductor region of $Al_{x1}Ga_{1-x1}N$ ($0 \leq x1 < 1$), a second semiconductor region of $Al_{x2}Ga_{1-x2}N$ ($0 < x2 < 1$ and $x1 < x2$), a third semiconductor region of $Al_{x3}Ga_{1-x3}N$ ($0 < x3 < 1$ and $x2 < x3$), a fourth semiconductor region of $Al_{x4}Ga_{1-x4}N$ ($0 < x4 < 1$ and $x2 < x4$), and a fifth semiconductor region of $Al_5Ga_{1-x5}N$ ($0 \leq x5 < x2$) or $In_{y1}Ga_{1-y1}N$ ($0 \leq y1 < 1$). The first electrode includes a first conductive region. The second electrode includes a second conductive region. The second conductive region is separated from the first conductive region in a first direction. The third electrode includes a third conductive region. A third position of the third conductive region in the first direction is between a first position of the first conductive region in the first direction and a second position of the second conductive region in the first direction. The first semiconductor region is separated from the first conductive region, the second conductive region, and the third conductive region in a second direction crossing the first direction. The second semiconductor region is provided between the first conductive region and the first semiconductor region in the second direction, between the second conductive region and the first semiconductor region in the second direction, and between the third conductive region and the first semiconductor region in the second direction. The third semiconductor region is provided between the first conductive region and the second semiconductor region in the second direction. The fourth semiconductor region is provided between the second conductive region and the second semiconductor region in the second direction. The fifth semiconductor region is provided between the third conductive region and the second semiconductor region in the second direction and provided between the third semiconductor region and the fourth semiconductor region in the first direction.

According to another embodiment, a method for manufacturing a semiconductor device is disclosed. The method can include forming a second semiconductor film of $Al_{x2}Ga_{1-x2}N$ ($0 < x2 < 1$ and $x1 < x2$) on a first semiconductor film of $Al_{x1}Ga_{1-x1}N$ ($0 \leq x1 < 1$), and forming an intermediate semiconductor film of $Al_{5x}Ga_{1-x5}N$ ($0 \leq x5 < x2$) or $In_{y1}Ga_{1-y1}N$ ($0 \leq y1 < 1$) on the second semiconductor region. The intermediate semiconductor film includes a first intermediate region, a second intermediate region, and a third intermediate region. The third intermediate region is between the first intermediate region and the second intermediate region. The method can include forming a mask on the third intermediate region, and exposing a portion of the second semiconductor film by removing the first intermediate region and the second intermediate region. In addition, the method can include forming a third semiconductor film of $Al_{x3}Ga_{1-x3}N$ ($0 < x3 < 1$ and $x2 < x3$) on the exposed portion of the second semiconductor film.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIG. 1 is a schematic cross-sectional view illustrating a semiconductor device according to an embodiment.

As shown in FIG. 1, the semiconductor device 110 according to the embodiment includes a first electrode 21, a second electrode 22, a third electrode 23, a first semiconductor region 11, a second semiconductor region 12, a third semiconductor region 13, a fourth semiconductor region 14, and a fifth semiconductor region 15. A substrate 10 and a buffer layer 10b are provided in the example.

The first electrode 21 includes a first conductive region 21a. The second electrode 22 includes a second conductive region 22b. The second conductive region 22b is separated from the first conductive region 21a in a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

The third electrode 23 includes a third conductive region 23c. A third position of the third conductive region 23c in the first direction (the X-axis direction) is between a first position of the first conductive region 21a in the first direction and a second position of the second conductive region 22b in the first direction. For example, at least a portion of the third conductive region 23c may be positioned between the first conductive region 21a and the second conductive region 22b in the X-axis direction.

The first semiconductor region 11, the second semiconductor region 12, the third semiconductor region 13, the fourth semiconductor region 14, and the fifth semiconductor region 15 include, for example, nitride semiconductors.

The first semiconductor region 11 is separated from the first conductive region 21a, the second conductive region 22b, and the third conductive region 23c in the second direction. The second direction crosses the first direction. The second direction is, for example, the Z-axis direction. The first semiconductor region 11 includes, for example, $Al_{x1}Ga_{1-x1}N$ ($0 \leq x1 < 1$).

In the second direction (the Z-axis direction), the second semiconductor region 12 is provided between the first conductive region 21a and the first semiconductor region 11, between the second conductive region 22b and the first semiconductor region 11, and between the third conductive region 23c and the first semiconductor region 11. The second semiconductor region 12 includes, for example, $Al_{x2}Ga_{1-x2}N$ ($0 < x2 < 1$ and $x1 < x2$).

The third semiconductor region 13 is provided between the first conductive region 21a and the second semiconductor region 12 in the second direction. The third semiconductor region 13 includes, for example, $Al_{x3}Ga_{1-x3}N$ ($0 < x3 < 1$ and $x2 < x3$).

The fourth semiconductor region 14 is provided between the second conductive region 22b and the second semiconductor region 12 in the second direction. The fourth semiconductor region 14 includes, for example, $Al_{x4}Ga_{1-x4}N$ ($0 < x4 < 1$ and $x2 < x4$).

The fifth semiconductor region 15 is provided between the third conductive region 23c and the second semiconductor region 12 in the second direction. The fifth semiconductor region 15 is provided between the third semiconductor region 13 and the fourth semiconductor region 14 in the first direction (the X-axis direction). The fifth semiconductor region 15 includes, for example, $Al_{x5}Ga_{1-x5}N$ ($0 \leq x5 < x2$). Or, the fifth semiconductor region 15 includes, for example, $In_{y1}Ga_{1-y1}N$ ($0 \leq y1 < 1$).

For example, the buffer layer 10b is provided on a first surface 10a of the substrate 10. The semiconductor regions recited above and the electrodes recited above are provided on the buffer layer 10b. The substrate 10 includes, for example, a silicon substrate. The material of the substrate 10 is arbitrary.

The first electrode 21 is electrically connected to the third semiconductor region 13. The second electrode 22 is electrically connected to the fourth semiconductor region 14. The first electrode 21 functions as one of a source electrode or a drain electrode. The second electrode 22 functions as the other of the source electrode or the drain electrode. The third electrode 23 functions as, for example, a gate electrode.

An insulating film 30 is provided as shown in FIG. 1. The insulating film 30 is provided between the fifth semiconductor region 15 and the third conductive region 23c of the third electrode 23. The insulating film 30 functions as, for example, a gate insulating film.

The first semiconductor region 11 includes a portion overlapping the third semiconductor region 13 in the Z-axis direction. At this portion, the lattice length (e.g., the lattice constant) decreases from the first semiconductor region 11 toward the third semiconductor region 13. The lattice length is the length in the stacking direction of the semiconductor regions (the Z-axis direction). The bandgap energy increases from the first semiconductor region 11 toward the third semiconductor region 13 at the portion that overlaps the third semiconductor region 13 in the Z-axis direction. Therefore, a two-dimensional electron gas 40 occurs in this region of the first semiconductor region 11 (referring to FIG. 1).

Similarly, the first semiconductor region 11 includes a portion overlapping the fourth semiconductor region 14 in the Z-axis direction. At this portion, the lattice length decreases from the first semiconductor region 11 toward the fourth semiconductor region 14. At the portion overlapping the fourth semiconductor region 14 in the Z-axis direction, the bandgap increases from the first semiconductor region 11 toward the fourth semiconductor region 14. Therefore, the two-dimensional electron gas 40 occurs in this region of the first semiconductor region 11 (referring to FIG. 1).

On the other hand, the first semiconductor region 11 includes a portion overlapping the fifth semiconductor region 15 in the Z-axis direction. As described above, the fifth semiconductor region 15 includes $Al_{x5}Ga_{1-x5}N$ ($0 \leq x5 < x2$). Or, the fifth semiconductor region 15 includes $In_{y1}Ga_{1-y1}N$ ($0 \leq y1 < 1$). On the other hand, the second semiconductor region 12 includes $Al_{x2}Ga_{1-x2}N$ ($0 < x2 < 1$ and $x1 < x2$). The lattice length increases along the direction from the second semiconductor region 12 toward the fifth semiconductor region 15. At the portion overlapping the fifth semiconductor region 15 in the Z-axis direction, the bandgap energy decreases along the direction from the second semiconductor region 12 toward the fifth semiconductor region 15. Therefore, the two-dimensional electron gas 40 substantially does not occur in the region of the first semiconductor region 11 overlapping the fifth semiconductor region 15 (referring to FIG. 1).

Therefore, in the semiconductor device 110 according to the embodiment, a current substantially does not flow between the first electrode 21 and the second electrode 22 when a voltage is not applied to the third electrode 23 (the off-state). Also, a current flows between the first electrode 21 and the second electrode 22 when a voltage is applied to the third electrode 23 (the on-state). Thus, a normally-off operation is possible in the semiconductor device 110.

For example, in a first state, the absolute value of the difference between the potential of the first electrode 21 and the potential of the third electrode 23 is a first value. For example, in a second state, the absolute value of the difference between the potential of the first electrode 21 and the potential of the third electrode 23 is a second value. The first value is greater than the second value. For example, the first state corresponds to the on-state. For example, the second state corresponds to the off-state. The current that flows when the voltage is applied between the first electrode 21 and the second electrode 22 in the first state is larger than the current that flows when the voltage is applied between the first electrode 21 and the second electrode 22 in the second state.

For example, the semiconductor device 110 is a normally-off HEMT (High Electron Mobility Transistor).

For example, in the case where a semiconductor region having a high Al composition ratio such as that of the third semiconductor region 13 is provided between the third electrode 23 and the second semiconductor region 12, the two-dimensional electron gas 40 occurs even in the region overlapping the third electrode 23. Therefore, the operation undesirably becomes normally-on. Or, the threshold voltage is low; and a stable normally-off operation is difficult.

For example, the bandgap energy of the fifth semiconductor region 15 is smaller than the bandgap energy of the second semiconductor region 12. For example, in the embodiment, the threshold voltage is high compared to a reference example in which the fifth semiconductor region 15 is not provided. For example, the normally-off operation is stable.

In the embodiment, for example, the piezoelectric polarization of the second semiconductor region 12 is relaxed by the fifth semiconductor region 15. By the relaxation of the piezoelectric polarization, for example, the occurrence of the two-dimensional electron gas 40 is suppressed effectively.

In the embodiment, for example, the fifth semiconductor region 15 physically contacts the second semiconductor region 12. Thereby, the occurrence of the two-dimensional electron gas 40 is effectively suppressed in the portion of the first semiconductor region 11 overlapping the fifth semiconductor region 15.

The second semiconductor region 12 has a thickness (a second semiconductor region thickness T12) along the second direction (the Z-axis direction). In the embodiment, the second semiconductor region thickness T12 is, for example, not less than 2 nanometers (nm) and not more than 10 nm. In the case where the second semiconductor region thickness T12 is excessively thick, the two-dimensional electron gas 40 occurs easily in the portion of the first semiconductor region 11 overlapping the fifth semiconductor region 15. A stable normally-off operation is obtained when the second semiconductor region thickness T12 is 10 nm or less.

The fifth semiconductor region 15 has a thickness (a fifth semiconductor region thickness T15) along the second direction (the Z-axis direction). In the embodiment, the fifth semiconductor region thickness T15 is, for example, 0.5 nm or more. In the case where the fifth semiconductor region thickness T15 is less than 0.5 nm, for example, the two-dimensional electron gas 40 occurs easily in the portion of the first semiconductor region 11 overlapping the fifth semiconductor region 15. A stable normally-off operation is obtained when the fifth semiconductor region thickness T15 is 0.5 nm or more.

As described below, the fifth semiconductor region thickness T15 can be formed by forming a semiconductor film used to form the fifth semiconductor region thickness T15 on the second semiconductor region 12 and by removing a portion of the semiconductor film. At this time, the removal of the semiconductor film is easy if the fifth semiconductor region thickness T15 is thin. The semiconductor film can be removed by processing in a hydrogen-containing atmosphere, etc. Damage of the second semiconductor region 12 which is the foundation when removing the semiconductor film can be suppressed. By setting the thickness of the semiconductor film (the fifth semiconductor region 15) to be thin, for example, the damage of the second semiconductor region 12 is suppressed.

The fifth semiconductor region thickness T15 is, for example, 5 nm or less. Thereby, for example, the damage of the second semiconductor region 12 is suppressed.

In the example, the third electrode 23 includes a fourth conductive region 23d and a fifth conductive region 23e. A portion of the third semiconductor region 13 is between the fourth conductive region 23d and the second semiconductor region 12 in the second direction (the Z-axis direction). A portion of the fourth semiconductor region 14 is between the fifth conductive region 23e and the second semiconductor region 12 in the second direction (the Z-axis direction).

In the example, a portion of the insulating film 30 is provided between the fourth conductive region 23d and the third semiconductor region 13. Another portion of the insulating film 30 is provided between the fifth conductive region 23e and the fourth semiconductor region 14. The insulating film 30 insulates between the fourth conductive region 23d and the third semiconductor region 13. The insulating film 30 insulates between the fifth conductive region 23e and the fourth semiconductor region 14.

A portion of the insulating film 30 is between the third electrode 23 and the third semiconductor region 13 in the first direction (the X-axis direction). Another portion of the insulating film 30 is between the third electrode 23 and the fourth semiconductor region 14 in the first direction (the X-axis direction).

A portion (the fourth conductive region 23d and the fifth conductive region 23e) of the third electrode 23 overlaps the third semiconductor region 13 and the fourth semiconductor region 14 in the Z-axis direction. The third electrode 23 overlaps the insulating film 30 positioned between the third electrode 23 and the third semiconductor region 13 in the Z-axis direction. The third electrode 23 overlaps the insulating film 30 positioned between the third electrode 23 and the fourth semiconductor region 14 in the Z-axis direction.

The first semiconductor region 11 includes a portion 11p overlapping the region between the third semiconductor region 13 and the third electrode 23. The first semiconductor region 11 includes a portion 11q overlapping the region between the fourth semiconductor region 14 and the third electrode 23. The third electrode 23 overlaps the portion 11p and the portion 11q in the Z-axis direction. For example, when the voltage is applied to the third electrode 23, carriers can be generated easily in the portion 11p and the portion 11q. Thereby, for example, the on-state resistance can be low. For example, faster operations are possible.

In the example shown in FIG. 1, the cross section of the fifth semiconductor region 15 along the X-Z plane (the plane parallel to the first direction and the second direction) is a trapezoid. The oblique surfaces of the trapezoid have a forward taper. As shown in FIG. 1, for example, the fifth semiconductor region 15 includes a first partial region 15a and a second partial region 15b. The second partial region 15b is between the first partial region 15a and the second semiconductor region 12 in the second direction (the Z-axis direction). The first partial region 15a has a first length L15a along the first direction (the X-axis direction). The second partial region 15b has a second length L15b along the first direction. The first length L15a is shorter than the second length L15b.

For example, as shown in FIG. 1, a portion (an end portion) of the fifth semiconductor region is positioned between the third semiconductor region 13 and the second semiconductor region 12 in the second direction (the Z-axis direction). Another portion (another end portion) of the fifth semiconductor region 15 is positioned between the fourth semiconductor region 14 and the second semiconductor region 12 in the second direction. For example, the third semiconductor region 13 or the fourth semiconductor region 14 is provided on the oblique surfaces of the fifth semiconductor region 15 having the tapered configuration.

As described below, for example, such a configuration of the fifth semiconductor region 15 is obtained by forming a semiconductor film used to form the fifth semiconductor region 15 on the second semiconductor region 12 and by removing a portion of the semiconductor film. Then, after removing the portion of the semiconductor film, another semiconductor film used to form the third semiconductor region 13 and the fourth semiconductor region 14 is formed.

In the process recited above, a mask that is described below is formed on the semiconductor film used to form the fifth semiconductor region 15; and patterning is performed.

The semiconductor film that is used to form the fifth semiconductor region 15 functions as, for example, a capping layer. By the semiconductor film used to form the fifth semiconductor region 15 functioning as a capping layer, the introduction of crystal defects into the region overlapping the fifth semiconductor region 15 in the second semiconductor region 12 and particularly inside the second semiconductor region 12 can be suppressed. As a result, the fluctuation of the threshold voltage can be suppressed.

For example, as a reference example of a normally-off semiconductor device, a reference example may be considered in which the third semiconductor region 13 and the fourth semiconductor region 14 are formed on a portion of the second semiconductor region 12; but the fifth semiconductor region 15 is not provided between the third semiconductor region 13 and the fourth semiconductor region 14. In the reference example, a mask (e.g., a silicon oxide film, etc.) that has a prescribed configuration is provided on the second semiconductor region 12 to selectively form the third semiconductor region 13 and the fourth semiconductor region 14. When patterning the mask, there are cases where residue (e.g., a silicon-containing substance) remains on the second semiconductor region 12 not covered with the mask. If the third semiconductor region 13 and the fourth semiconductor region 14 are formed on the second semiconductor region 12 where the residue exists, the characteristics of the third semiconductor region 13 and the fourth semiconductor region 14 may fluctuate. Therefore, in such a reference example, the on-state resistance increases easily. In the reference example, the breakdown voltage in the X-axis direction (e.g., the lateral breakdown voltage) decreases easily.

In the embodiment, for example, a semiconductor film that is used to form the fifth semiconductor region 15 is formed; a mask is formed on the semiconductor film; and a portion of the semiconductor film is removed. The removal of the portion of the semiconductor film can be implemented by processing including hydrogen, etc. Therefore, this portion is removed even in the case where the residue remains on the portion of the semiconductor film when forming the mask. Then, the second semiconductor region 12 is exposed by the removal of the semiconductor film; and the third semiconductor region 13 and the fourth semiconductor region 14 are formed (crystal growth) on the exposed second semiconductor region 12. The fluctuation of the characteristics of the third semiconductor region 13 and the fourth semiconductor region 14 can be suppressed. Thereby, the increase of the on-state resistance can be suppressed. The decrease of the breakdown voltage in the X-axis direction can be suppressed.

In the embodiment, the occurrence of impurities such as silicon, etc., can be suppressed at the interface between the second semiconductor region 12 and the third semiconductor region 13 and at the interface between the second semiconductor region 12 and the fourth semiconductor region 14. Thereby, for example, the breakdown voltage in the X-axis direction (e.g., the lateral breakdown voltage) can be increased.

In the embodiment, the MOS interface has, for example, a stacked structure of the insulating film 30/fifth semiconductor region 15/second semiconductor region 12. Because the fifth semiconductor region 15 that has the low Al composition contacts the insulating film 30, the MOS interface is stabilized easily compared to the case where a semiconductor region having a high Al composition contacts the insulating film 30. The fluctuation of the threshold voltage is suppressed.

An example of the semiconductor region will now be described.

In the first semiconductor region 11, for example, the composition ratio x1 is 0.01 or less. The first semiconductor region 11 includes, for example, GaN. The (residual) carrier concentration of the first semiconductor region 11 is, for example, less than $1 \times 10^{-17}$ cm$^{-3}$. The first semiconductor region 11 is, for example, GaN in which an impurity is not deliberately doped (ud-GaN). For example, intrinsic GaN (i-GaN) is used.

In the second semiconductor region 12, for example, the composition ratio x2 is not less than 0.1 but less than 0.2. The second semiconductor region 12 includes, for example, $Al_{0.15}Ga_{0.85}N$. The second semiconductor region thickness T12 of the second semiconductor region 12 along the second direction is, for example, not less than 2 nanometers and not more than 10 nanometers.

In the third semiconductor region 13, the composition ratio x3 is, for example, not less than 0.2 and not more than 0.3. The third semiconductor region 13 includes, for example, $Al_{0.3}Ga_{0.7}N$. A thickness T13 of the third semiconductor region 13 along the second direction is, for example, not less than 20 nanometers and not more than 50 nanometers.

In the fourth semiconductor region 14, the composition ratio x4 is, for example, not less than 0.2 and not more than 0.3. For example, the composition ratio x4 is substantially the same as the composition ratio x3. For example, the difference between the composition ratio x3 and the composition ratio x4 is not more than 0.1 times the composition ratio x3. The fourth semiconductor region 14 includes, for example, $Al_{0.3}Ga_{0.7}N$. A thickness T14 of the fourth semiconductor region 14 along the second direction is, for example, not less than 20 nanometers and not more than 50 nanometers. The difference between the thickness T13 and the thickness T14 is, for example, not more than 0.1 times the thickness T13.

In the case where the fifth semiconductor region 15 includes $Al_{x5}Ga_{1-x5}N$ ($0 \leq x5 < x2$), the composition ratio x5 is, for example, 0.01 or less. The fifth semiconductor region 15 is, for example, GaN. In the case where the fifth semiconductor region 15 includes $In_{y1}Ga_{1-y1}N$, the composition ratio y1 may be 0.01 or less. The composition ratio y1 may be greater than 0.01. Thereby, for example, the lattice constant of the fifth semiconductor region 15 is larger than the lattice constant of the second semiconductor region 12.

The bandgap energy of the fifth semiconductor region 15 is small in the case where the fifth semiconductor region 15 includes In. The lattice length of the fifth semiconductor region 15 is large in the case where the fifth semiconductor region 15 includes In. Piezoelectric polarization in the region overlapping the third electrode 23 is suppressed easily. Thereby, the threshold voltage is high. A more stable normally-off operation is obtained.

In the case where the semiconductor film used to form the fifth semiconductor region 15 includes In, for example, the semiconductor film is removed easily by hydrogen-containing processing, etc. Therefore, the temperature of this processing can be low. The damage of the second semiconductor region 12 can be suppressed further.

The fifth semiconductor region 15 includes, for example, at least one selected from the group consisting of Mg, Zn, and C. For example, the fifth semiconductor region 15 is of the p-type. Thereby, the energy of the conduction band on the third electrode 23 side increases. Thereby, the threshold voltage can be high. Thereby, for example, the normally-off operation is stabilized further.

The insulating film 30 includes, for example, at least one selected from the group consisting of an oxide of silicon, a nitride of silicon, an oxynitride of silicon, an oxide of a metal, a nitride of a metal, and an oxynitride of a metal.

At least one of the first electrode 21 or the second electrode 22 includes, for example, at least one selected from the group consisting of Al, Ti, Ni, and Au. The third electrode 23 includes, for example, at least one selected from the group consisting of Al, Ni, Au, TiN, WN, and polysilicon.

An example of a method for manufacturing the semiconductor device according to the embodiment will now be described.

FIG. 2A to FIG. 2D are schematic cross-sectional views in order of the processes, illustrating the method for manufacturing the semiconductor device according to the embodiment.

Figure 2A:
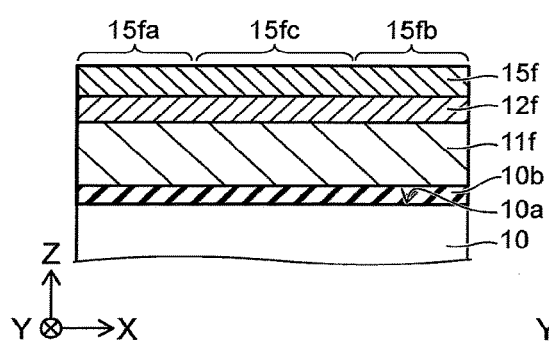
FIG. 2A to FIG. 2D are schematic cross-sectional views in order of the processes, illustrating a method for manufacturing the semiconductor device according to the embodiment.

As shown in FIG. 2A, the buffer layer 10b is formed on the first surface 10a of the substrate 10. A first semiconductor film 11f is formed on the buffer layer 10b. The first semiconductor film 11f is, for example, $Al_{x1}Ga_{1-x1}N$ ($0 \le x1 < 1$). A second semiconductor film 12f is formed on the first semiconductor film 11f. The second semiconductor film 12f is, for example, $Al_{x2}Ga_{1-x2}N$ ($0 < x2 < 1$ and $x1 < x2$). An intermediate semiconductor film 15f is formed on the second semiconductor film 12f. The intermediate semiconductor film 15f is, for example, $Al_{x5}Ga_{1-x5}N$ ($0 \le x5 < x2$) or $In_{y1}Ga_{1-y1}N$ ($0 \le y1 < 1$). The intermediate semiconductor film 15f includes a first intermediate region 15fa, a second intermediate region 15fb, and a third intermediate region 15fc. The third intermediate region 15fc is between the first intermediate region 15fa and the second intermediate region 15fb. The formation of the intermediate semiconductor film 15f is performed continuously with the formation of the second semiconductor film 12f inside one processing chamber. For example, these semiconductor films are formed by crystal growth.

Figure 2B:
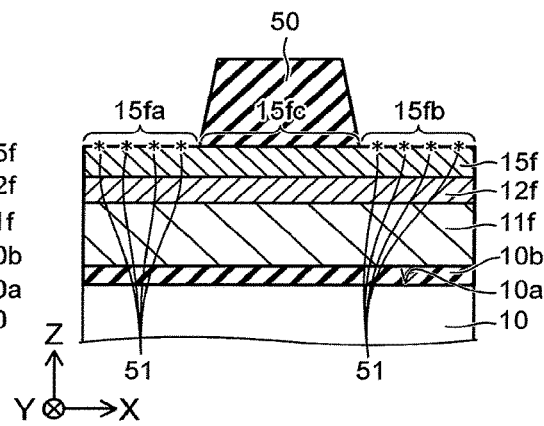

As shown in FIG. 2B, a mask 50 is formed on the third intermediate region 15fc. The mask 50 includes, for example, silicon oxide. For example, a film that includes silicon oxide used to form the mask 50 is formed on the intermediate semiconductor film 15f. A portion of the mask 50 is removed using photolithography. The mask 50 is not provided on the first intermediate region 15fa and the second intermediate region 15fb. The cross section of the mask 50 is, for example, a trapezoid having a forward taper. When forming the mask 50, residue 51 that includes silicon may be adhered to the surfaces of the first intermediate region 15fa and the second intermediate region 15fb.

Figure 2C:
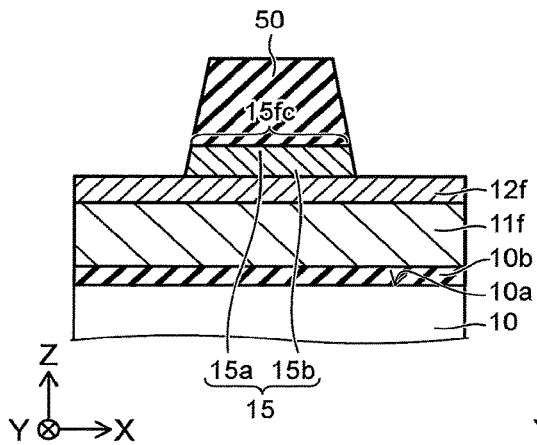

As shown in FIG. 2C, the first intermediate region 15fa and the second intermediate region 15fb are removed using the mask 50 as a mask of the etching. Thereby, a portion of the second semiconductor film 12f is exposed. The residue 51 is removed with the first intermediate region 15fa and the second intermediate region 15fb. The removal of the first intermediate region 15fa and the second intermediate region 15fb includes, for example, processing in a hydrogen atmosphere. The processing in the hydrogen atmosphere includes, for example, heat treatment in an atmosphere including hydrogen. The heat treatment may include, for example, non-plasma heat treatment in which plasma is not used. The fifth semiconductor region 15 is obtained from the intermediate semiconductor film 15f. For example, the fifth semiconductor region 15 has a trapezoid configuration having a forward taper.

Figure 2D:
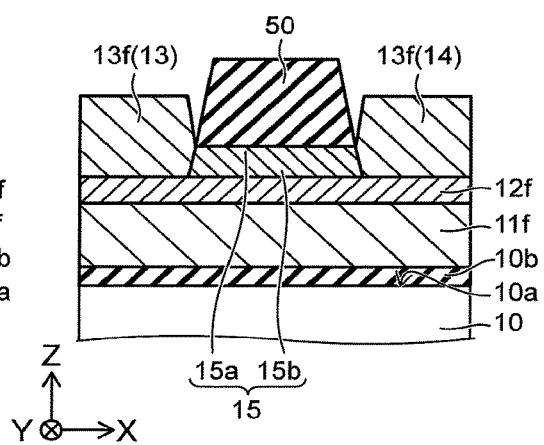

As shown in FIG. 2D, a third semiconductor film 13f is formed on a portion of the exposed second semiconductor film 12f. The third semiconductor film 13f is used to form the third semiconductor region 13 and the fourth semiconductor region 14. The third semiconductor film 13f is formed by, for example, crystal growth using MOCVD. The third semiconductor film 13f is substantially not formed on the mask 50. The third semiconductor film 13f is formed selectively on the second semiconductor film 12f.

The formation of the third semiconductor film 13f and the removal of the first intermediate region 15fa and the second intermediate region 15fb may be performed continuously inside one processing chamber. For example, a MOCVD apparatus may be used to remove the first intermediate region 15fa and the second intermediate region 15fb and form the third semiconductor film 13f. For example, the removal of the first intermediate region 15fa and the second intermediate region 15fb and the formation of the third semiconductor film 13f may be performed continuously inside one processing chamber of the MOCVD apparatus.

Thus, the first semiconductor region 11, the second semiconductor region 12, the third semiconductor region 13, the fourth semiconductor region 14, and the fifth semiconductor region 15 are formed on the first surface 10a of the substrate 10. Subsequently, the insulating film 30, the first electrode 21, the second electrode 22, and the third electrode 23 are formed. Thereby, the semiconductor device 110 is formed.

In the method for the manufacturing recited above, the third semiconductor film 13f is formed on a portion of the second semiconductor film 12f exposed by removing the first intermediate region 15fa and the second intermediate region 15fb. Thereby, the third semiconductor region 13 and the fourth semiconductor region 14 are formed on a portion of the second semiconductor region 12.

By forming the third semiconductor region 13 and the fourth semiconductor region 14 in such an order, for example, the amount of the residue 51 can be reduced at the interface (the regrown interface) between the third semiconductor region 13 and the second semiconductor region 12 and the interface (the regrown interface) between the fourth semiconductor region 14 and the second semiconductor region 12. For example, regrown interfaces having reduced amounts of the residue 51 are obtained. Thereby, for example, the lateral breakdown voltage can be increased.

According to the method for the manufacturing recited above, a method for manufacturing a semiconductor device can be provided in which the operational stability can be improved.

Figure 3:
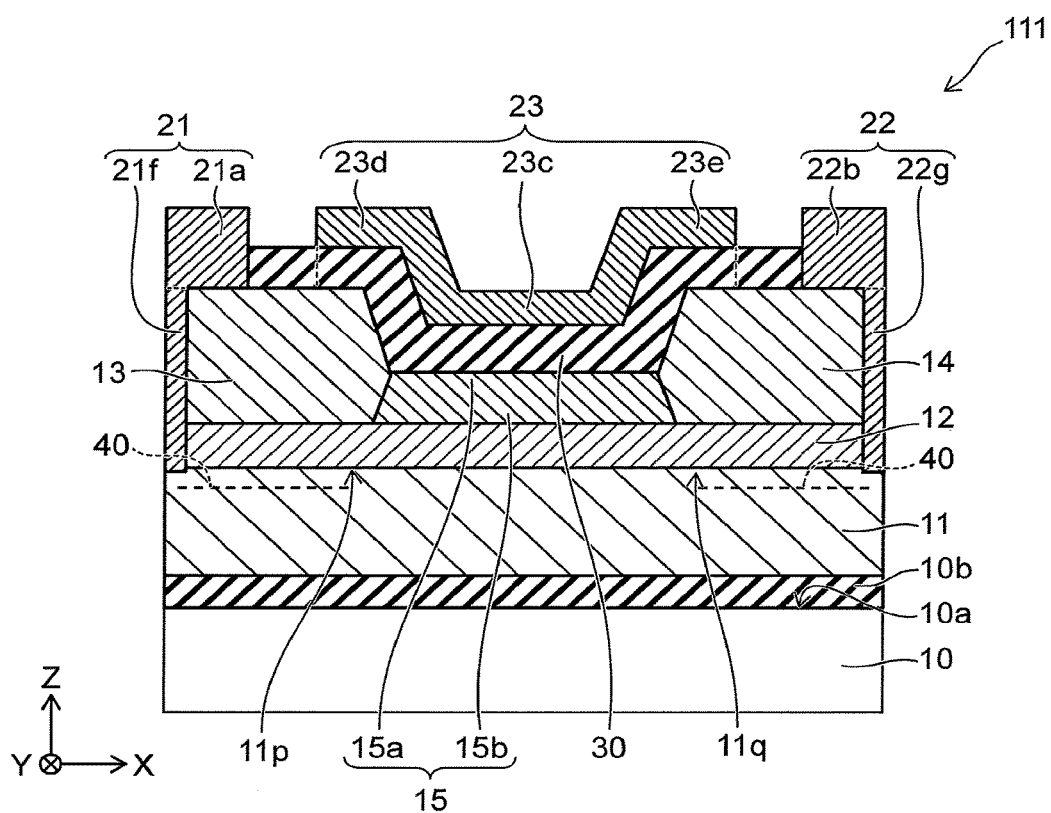
FIG. 3 is a schematic cross-sectional view illustrating a semiconductor device according to another example of the embodiment.

FIG. 3 is a schematic cross-sectional view illustrating a semiconductor device according to another example of the embodiment.

In the semiconductor device 111 according to the embodiment as shown in FIG. 3, the first electrode 21 further includes a sixth conductive region 21f. The sixth conductive region 21f is continuous with the first conductive region 21a. The second electrode 22 further includes a seventh conductive region 22g. The seventh conductive region 22g is continuous with the second conductive region 22b. The second semiconductor region 12, the third semiconductor region 13, the fourth semiconductor region 14, and the fifth semiconductor region 15 are between the sixth conductive region 21f and the seventh conductive region 22g in the first direction. Otherwise, the configuration of the semiconductor device 111 is similar to that of the semiconductor device 110.

In the semiconductor device 111, the first electrode 21 and the second electrode 22 may contact the first semiconductor region 11. The first electrode 21 may contact at least a portion of the side surface of the third semiconductor region 13. The second electrode 22 may contact at least a portion of the side surface of the fourth semiconductor region 14. The current path is stabilized by the sixth conductive region 21f and the seventh conductive region 22g.

According to the embodiments, a semiconductor device and a method for manufacturing the semiconductor device can be provided in which the operational stability can be improved.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$)

for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

The embodiments of the invention are not limited to the embodiments recited above.

Hereinabove, embodiments of the invention are described with reference to specific examples. However, the invention is not limited to these specific examples. For example, one skilled in the art may similarly practice the invention by appropriately selecting specific configurations of components included in the semiconductor device such as the electrode, the semiconductor regions, the insulating film, the substrate, the buffer layer, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

Also, all semiconductor devices and methods for manufacturing semiconductor devices practicable by an appropriate design modification by one skilled in the art based on the semiconductor devices and the methods for manufacturing semiconductor devices described above as embodiments of the invention are within the scope of the invention to the extent that the spirit of the invention is included.

Various modifications and alterations within the spirit of the invention will be readily apparent to those skilled in the art; and all such modifications and alterations should be seen as being within the scope of the invention.

Although embodiments of the invention are described, the embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A semiconductor device, comprising:
   a first electrode including a first conductive region;
   a second electrode including a second conductive region, the second conductive region being separated from the first conductive region in a first direction;
   a third electrode including a third conductive region, a third position of the third conductive region in the first direction being between a first position of the first conductive region in the first direction and a second position of the second conductive region in the first direction;
   a first semiconductor region of $Al_{x1}Ga_{1-x1}N$ ($0 \leq x1 < 1$) separated from the first conductive region, the second conductive region, and the third conductive region in a second direction crossing the first direction;
   a second semiconductor region of $Al_{x2}Ga_{1-x2}N$ ($0 < x2 < 1$ and $x1 < x2$) provided between the first conductive region and the first semiconductor region in the second direction, between the second conductive region and the first semiconductor region in the second direction, and between the third conductive region and the first semiconductor region in the second direction;
   a third semiconductor region of $Al_{x3}Ga_{1-x3}N$ ($0 < x3 < 1$ and $x2 < x3$) provided between the first conductive region and the second semiconductor region in the second direction;
   a fourth semiconductor region of $Al_{x4}Ga_{1-x4}N$ ($0 < x4 < 1$ and $x2 < x4$) provided between the second conductive region and the second semiconductor region in the second direction; and
   a fifth semiconductor region of $Al_{x5}Ga_{1-x5}N$ ($0 \leq x5 < x2$) or $In_{y1}Ga_{1-y1}N$ ($0 \leq y1 < 1$) provided between the third conductive region and the second semiconductor region in the second direction and provided between the third semiconductor region and the fourth semiconductor region in the first direction.

2. The device according to claim 1, wherein the fifth semiconductor region contacts the second semiconductor region.

3. The device according to claim 1, wherein y1 is 0.01 or less.

4. The device according to claim 1, wherein y1 is greater than 0.

5. The device according to claim 1, wherein
   the fifth semiconductor region includes a first partial region and a second partial region,
   the second partial region is between the first partial region and the second semiconductor region in the second direction, and
   a first length along the first direction of the first partial region is shorter than a second length along the first direction of the second partial region.

6. The device according to claim 1, wherein
   a portion of the fifth semiconductor region is positioned between the third semiconductor region and the second semiconductor region in the second direction, and
   another portion of the fifth semiconductor region is positioned between the fourth semiconductor region and the second semiconductor region in the second direction.

7. The device according to claim 1, wherein
   the third electrode further includes a fourth conductive region and a fifth conductive region,
   a portion of the third semiconductor region is between the fourth conductive region and the second semiconductor region in the second direction, and
   a portion of the fourth semiconductor region is between the fifth conductive region and the second semiconductor region in the second direction.

8. The device according to claim 7, further comprising an insulating film provided between the third conductive region and the fifth semiconductor region, between the fourth conductive region and the third semiconductor region, and between the fifth conductive region and the fourth semiconductor region.

9. The device according to claim 1, wherein the semiconductor device is normally-off.

10. The device according to claim 1, wherein a fifth semiconductor region thickness along the second direction of the fifth semiconductor region is 5 nanometers or less.

11. The device according to claim 10, wherein the fifth semiconductor region thickness is 0.5 nanometers or more.

12. The device according to claim 1, wherein a second semiconductor region thickness along the second direction of the second semiconductor region is not less than 2 nanometers and not more than 10 nanometers.

13. The device according to claim 1, wherein the fifth semiconductor region includes at least one selected from the group consisting of Mg, Zn, and C.

14. The device according to claim 1, wherein
the first electrode is electrically connected to the third semiconductor region, and
the second electrode is electrically connected to the fourth semiconductor region.

15. The device according to claim 14, wherein
the first electrode further includes a sixth conductive region continuous with the first conductive region,
the second electrode further includes a seventh conductive region continuous with the second conductive region, and
the second semiconductor region, the third semiconductor region, the fourth semiconductor region, and the fifth semiconductor region are between the sixth conductive region and the seventh conductive region in the first direction.

16. The device according to claim 1, wherein
x3 is not less than 0.2 and not more than 0.3, and
x4 is not less than 0.2 and not more than 0.3.

17. The device according to claim 1, wherein a difference between x3 and x4 is not more than 0.1 times x3.

18. The device according to claim 1, wherein a difference between a third semiconductor region thickness along the second direction of the third semiconductor region and a fourth semiconductor region thickness along the second direction of the fourth semiconductor region is not more than 0.1 times the third semiconductor region thickness.

19. The device according to claim 18, wherein
the third semiconductor region thickness is not less than 20 nanometers and not more than 50 nanometers, and
the fourth semiconductor region thickness is not less than 20 nanometers and not more than 50 nanometers.

* * * * *